United States Patent [19]

Takano et al.

[11] Patent Number: 5,340,434
[45] Date of Patent: Aug. 23, 1994

[54] PROCESS FOR PRODUCING SILICON SINGLE CRYSTAL

[75] Inventors: Kiyotaka Takano; Izumi Fusegawa; Hirotoshi Yamagishi, all of Annaka, Japan

[73] Assignee: Shin-Etsu Handotai Co., Ltd., Tokyo, Japan

[21] Appl. No.: 11,744

[22] Filed: Feb. 1, 1993

[30] Foreign Application Priority Data

Jan. 30, 1992 [JP] Japan .................. 4-038394

[51] Int. Cl.$^5$ .................................. C30B 29/06
[52] U.S. Cl. ........................ 117/21; 117/33; 117/932
[58] Field of Search ....... 156/617.1, 620.4, DIG. 115; 422/251, 253

[56] References Cited

U.S. PATENT DOCUMENTS

| | | | |
|---|---|---|---|
| 4,911,895 | 3/1990 | Kida et al. | 156/617.1 |
| 4,980,015 | 12/1990 | Ono et al. | 156/617.1 |
| 5,009,863 | 4/1991 | Shima et al. | 156/617.1 |
| 5,037,503 | 8/1991 | Kajimoto et al. | 156/620.4 |
| 5,126,114 | 6/1992 | Kamio et al. | 156/617.1 |
| 5,242,531 | 9/1993 | Klingshirn et al. | 156/617.1 |

FOREIGN PATENT DOCUMENTS 0363742 4/1990 European Pat. Off. .
0450393 10/1991 European Pat. Off. .

OTHER PUBLICATIONS

Database WPIL, No. 90-251 067, Derwent Publications Ltd., London, GB (1990).

Primary Examiner—R. Bruce Breneman
Assistant Examiner—Felisa Garrett
Attorney, Agent, or Firm—Oliff & Berridge

[57] ABSTRACT

A process for producing a silicon single crystal is disclosed which comprises the steps of providing a silicon melt in a crucible, feeding grains of silicon polycrystal to the silicon melt and pulling up a silicon single crystal from the silicon melt. The concentration of residual hydrogen in the grains of silicon polycrystal is more than 10 ppmwt and less than 100 ppmwt. The process prevents the silicon single crystal from being polycrystalline.

2 Claims, 2 Drawing Sheets

PROCESS FOR PRODUCING SILICON SINGLE CRYSTAL

BACKGROUND OF THE INVENTION

1. Field of the Invention

The present invention relates to a process for producing a silicon single crystal and more particularly to a process for pulling up the silicon single crystal by the Czochralski method (referred to as a CZ method hereinafter).

2. Description of the Related Art

In growing a silicon single crystal by the CZ method, a dopant such as phosphorus (P) or boron (B) is added to a silicon melt in a crucible after a raw silicon polycrystal is melted and the silicon single crystal is grown after the concentration of the dopant in the melt is controlled. However, since the segregation coefficient of the dopant is less than one (the segregation coefficient of phosphorus is 0.35,the segregation coefficient of boron is 0.75), the concentration of the dopant in the melt increases during growth of the silicon single crystal. And the resistivity of the resulting silicon single crystal rod decreases from the head to the tail of the silicon single crystal rod. Since the usable length of the silicon single crystal rod must be so much reduced as an allowable range of a dispersion in the resistivity is narrow, a product weight to raw material weight ratio is reduced to reduce the yield of the silicon single crystal. In order to maintain constant the concentration of the dopant in the melt and thereby grow a silicon single crystal of a uniform resistivity dispersion in the direction of the growth of the silicon single crystal, there have been developed a method of continuously charging appropriate amounts of undoped silicon polycrystal during growth of the silicon single crystal (a melt-reduced continuous charge method) and a method of charging appropriate amounts of undoped silicon polycrystal and appropriate amounts of a dopant in response to a degree of growth of the silicon single crystal to continuously maintain constant the amount of the melt and the concentration of the dopant in the melt (a melt-constant continuous charge method).

Silicon polycrystal ingot or a block-shaped silicon polycrystal has been employed as the raw silicon polycrystal in both the melt-reduced and melt-constant continuous charge methods. Since simply soaking the silicon polycrystal ingot in the melt cannot control the amount of silicon polycrystal ingot fed to the melt, it has been proposed that a heater for melting the silicon polycrystal ingot is provided in a chamber for growth of single crystal or that a chamber is separated into a chamber for growth of single crystal and a chamber for melting raw silicon polycrystal and a quartz piping connects the chamber for growth of single crystal to the chamber for melting raw silicon polycrystal. However, the both cases are impractical since the systems of the cases are complicated and expensive.

On the other hand, since the weights of block-shaped silicon polycrystals are relatively heavy and a dispersion in the weights of block-shaped silicon polycrystals is high when the block-shaped silicon polycrystals are employed as the raw material, it is difficult to precisely control the amount of silicon polycrystal fed to the melt. In addition, since the weights of the block-shaped silicon polycrystals are heavy, a feed piping for the raw silicon polycrystal must be designed in view of a physical impact on the feed piping.

In order to overcome the above-described problems, it has been recently proposed that grains of silicon polycrystal produced by a reaction on a fluidized bed from a high purity silane or trichlorosilane are employed as the raw silicon polycrystal. This method requires no provision of a heater for melting the grains of silicon polycrystal and can precisely control the amount of the raw silicon polycrystal fed to the melt. In addition, a feeder for the grains of silicon polycrystal is easily designed.

However, the present inventors discovered that since the production of the grains of silicon polycrystal by the reaction on the fluidized bed contains a large amount of residual hydrogen in the grains of silicon polycrystal, when the grains of silicon polycrystal are dropped into the melt, the melt splashes during a continuous charge of the grains of silicon polycrystal. That is, since the grains of silicon polycrystal are instantly exposed to an ultra high temperature (melting point of silicon of 1420° C.) when they dropped to the melt, the residual hydrogen in the grains of silicon polycrystal causes splashes of the melt. On the other hand, a dehydrogenation of the grains of silicon polycrystal by a high temperature heat treatment for preventing the splashing of the melt tends to make a growing silicon single crystal polycrystalline. It is supposed that since the dehydrogenated grains of silicon polycrystal require a long time until they are fully melted in the melt after the drops of the grains to the melt, the isolation effect of a separating wall (internal crucible) is relatively reduced and semimolten grains of silicon polycrystal rise to the surface of the melt in the internal crucible. That is, it is supposed that a probability that grains of silicon polycrystal in a solid state go around the bottom of the internal crucible and reach the silicon single crystal rod is increased. Thus, the silicon single crystal rod tends to be made polycrystalline.

SUMMARY OF THE INVENTION

An object of the present invention is to provide a process for producing a silicon single crystal which can effectively prevent the silicon single crystal from being made polycrystalline during growth.

In order to achieve the object, a first aspect of the present invention comprises the steps of providing a silicon melt in a crucible, feeding grains of silicon polycrystal to the silicon melt, the concentration of residual hydrogen in the grains of silicon polycrystal being more than 10 ppmwt and less than 100 ppmwt, and pulling up a silicon single crystal from the silicon melt.

A second aspect of the present invention comprises the steps of providing a silicon melt in a crucible, continuously feeding a controlled amount of grains of silicon polycrystal to the silicon melt concurrently with a growth of a silicon single crystal, the concentration of residual hydrogen in the grains of silicon polycrystal being more than 10 ppmwt and less than 100 ppmwt, and pulling up the silicon single crystal from the silicon melt.

A use of the grains of silicon polycrystal of the concentration of residual hydrogen more than 10 ppmwt and less than 100 ppmwt prevents an emission of gaseous hydrogen at a moment the grains of silicon polycrystal drop into the silicon melt in the crucible to prevent a splash of the silicon melt even if they are exposed to an ultra high temperature (e.g. the melting point of silicon of 1420° C.).

When the grains of silicon polycrystal of the concentration of residual hydrogen more than 10 ppmwt and less than 100 ppmwt are employed as a raw material in a method of continuously charging an undoped silicon polycrystal in a process for producing the silicon single crystal, they prevent a splash of the silicon melt in the crucible and the silicon single crystal from being made polycrystalline since they are not an almost fully dehydrogenated silicon polycrystal.

Thus, the performance of the method of the continuous charge of the grains of silicon polycrystal is remarkably improved. This is decisively advantageous since the feed speed of the raw silicon polycrystal must be increased correspondingly to an increase in the weight of the silicon single crystal when a silicon single crystal having a large diameter is grown.

Other objects, features and advantages of the present invention will be apparent from a consideration of the following description, taken in connection with the accompanying drawing.

DESCRIPTION OF THE PREFERRED EMBODIMENT

Figure 1:
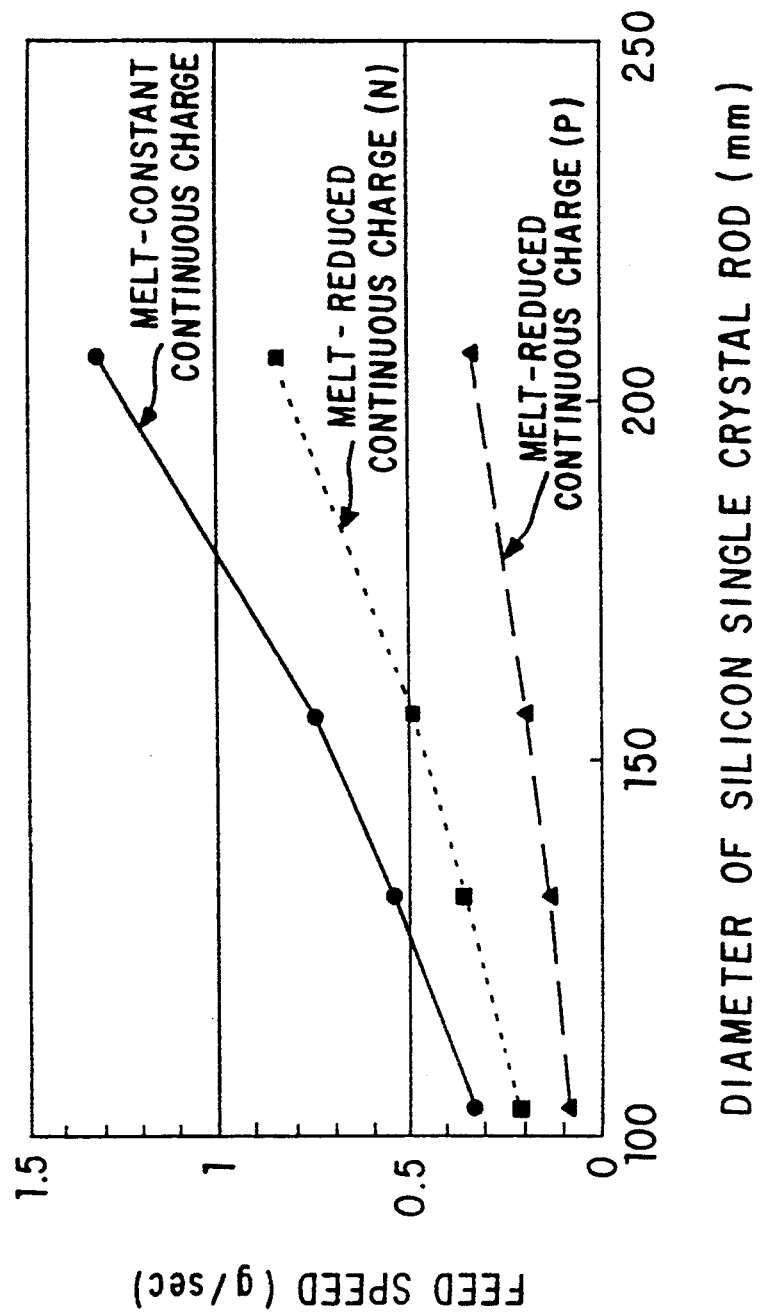
FIG. 1 is a graph of a feed of grains of silicon polycrystal with time.

A preferred embodiment of the present invention will be described with reference to the drawings.

In a process for producing a silicon single crystal according to an embodiment of the present invention, both the melt-reduced continuous charge method and the melt-constant continuous charge method employ grains of silicon polycrystal of which a concentration of residual hydrogen of is more than 10 ppmwt and less than 100 ppmwt as an undoped raw silicon polycrystal in pulling up the silicon single crystal.

The grains of silicon polycrystal are produced, e.g., by the following steps:

1) Production of trichlorosilane

$$Si(crude) + 3HCl \rightarrow SiHCl_3 + H_2$$

A distillation highly purifies the resulting trichlorosilane;

2) Production of silicon polycrystal

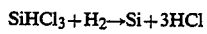
$$SiHCl_3 + H_2 \rightarrow Si + 3HCl$$

where a thermal decomposition of trichlorosilane by a reaction on a fluidized bed produces the grains of silicon polycrystal. The grains of silicon polycrystal may alternatively be produced by the following equation:

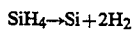
$$SiH_4 \rightarrow Si + 2H_2$$

In order to inspect the effect of the embodiment of the present invention, a test described below was conducted on the embodiment. Silicon single crystals were produced using various grains of silicon polycrystal having different concentrations of residual hydrogen and the monocrystallinity of the resulting silicon single crystals was determined. The concentrations of the residual hydrogen in the grains of silicon polycrystal were determined by the Ethyl Co. method. An infrared beam was transmitted to the grains of silicon polycrystal and the infrared absorption spectra of the grains of silicon polycrystal were determined by the FT-IR (Fourier transform infrared spectroscopy). A peak intensity of the infrared absorption spectra near 2000/cm gave the concentrations of the residual hydrogen.

The Ethyl Co. method and the FT-IR will be described in detail hereinafter.

Ethyl Co. Method

Grains of silicon polycrystal of 50 g ±0.01 g (a sample) was fastened to the center of the interior of a combustion tube by means of glass wool. The combustion tube was placed in a furnace at a temperature of 100° C. or less. Gaseous argon of 10 ml/min purged an original gas (especially nitrogen) out of the combustion tube for 15 min. The gaseous argon passed through a thermal conductivity sensor electrically and pneumatically balanced and was discarded from the combustion tube. Subsequently, the sample was heat treated at 225° C. for 30 min to eliminate a gas adsorbed on the surface of the sample. During this time, no changes in a signal from the thermal conductivity sensor were integrated. After the degassing of the sample, a furnace temperature was increased at a rate of 20° C./min to 1200° C. and subsequently maintained at 1200° C. until gaseous argon fully purged hydrogen out of the sample. A full dehydrogenation of the sample required approximately 3 hr. For these hours, signals from the thermal conductivity sensor were integrated. A computer controlled collections of data in all of heat treatment steps and finally produced an output of a concentration of residual hydrogen in the sample. For the calibration of the Ethyl Co. system, a cylindrical pump injected pure hydrogen of 0.1-10 ml into gaseous argon for a few hours. This injection simulates hydrogen from real sample in gaseous argon as a carrier. The system was calibrated within the range of a concentration of hydrogen of 4-1000 ppma in a silicon polycrystal. The calibration is linear within the range of this concentration and has a precision of ±5-6% in relative standard deviation.

Determination of Concentration of Residual Hydrogen by FT-IR

In the determination of the concentration of the residual hydrogen by FT-IR, a casing was made of a wafer in the form of a polishing wafer (PW) and the infrared absorbance of the case gave a background for the determination of the infrared absorbance of the grains of silicon polycrystal. Subsequently, a few number of grains of silicon polycrystal previously classified by grain sizes were placed in the casing. An infrared radiation was subsequently transmitted to the casing holding the grains of silicon polycrystal for the determination of the infrared absorbance of the grains. The infrared absorption (reflection) spectra of the grains of silicon polycrystal were determined.

The FT-IR is a technique of using a spectroscope to analyze the infrared absorption or reflection spectra of a sample and gives a high-speed, high-sensitive, noncontact and nondestructive evaluator. An optical system of a FT-IR apparatus has a structure in which an infrared beam from a source of light is collimated and then enters a Michelson interferometer. The FT-IR apparatus transmits an infrared radiation from the Michelson interferometer to the sample and senses an interfered infrared radiation penetrating through or reflected by the sample. The FT-IR apparatus determines an interfered waveform of the sensed interfered infrared radiation as a function of an optical path difference caused by the operation of a movable mirror of the Michelson interferometer, applied Fourier transformation on the interfered waveform of the collimated infrared radiation penetrating through or reflected by the sample with an interfered waveform of a reference infrared radiation neither penetrating through nor reflected by the sample, and produces the infrared absorption or reflection spectra of the sample from a difference between the two interfered waveforms.

Since the determination of the concentration of the residual hydrogen discovered that the peak intensity of the infrared absorption spectra was near 2000/cm, the peak intensity was selected for the determination of the concentration of the residual hydrogen.

Various silicon single crystals were made from groups of grains of silicon polycrystal having various concentrations of the residual hydrogen by the melt-reduced continuous charge method or the melt-constant continuous charge method. FIG. 1 shows computed feed speeds of the grains of silicon polycrystal of a case where an N type silicon single crystal is pulled up by the melt-reduced continuous charge method, a case where a P type silicon single crystal is pulled up by the melt-reduced continuous charge method and a case where a silicon single crystal is pulled up by the melt-constant continuous charge method. The crystal growth speed SE was computed in a unit of 1.0 mm/min. The feed speeds of the grains of silicon polycrystal in the melt-reduced continuous charge method were computed on a condition that the resistivity through the silicon single crystal rod was flat lengthwise.

Figure 2:
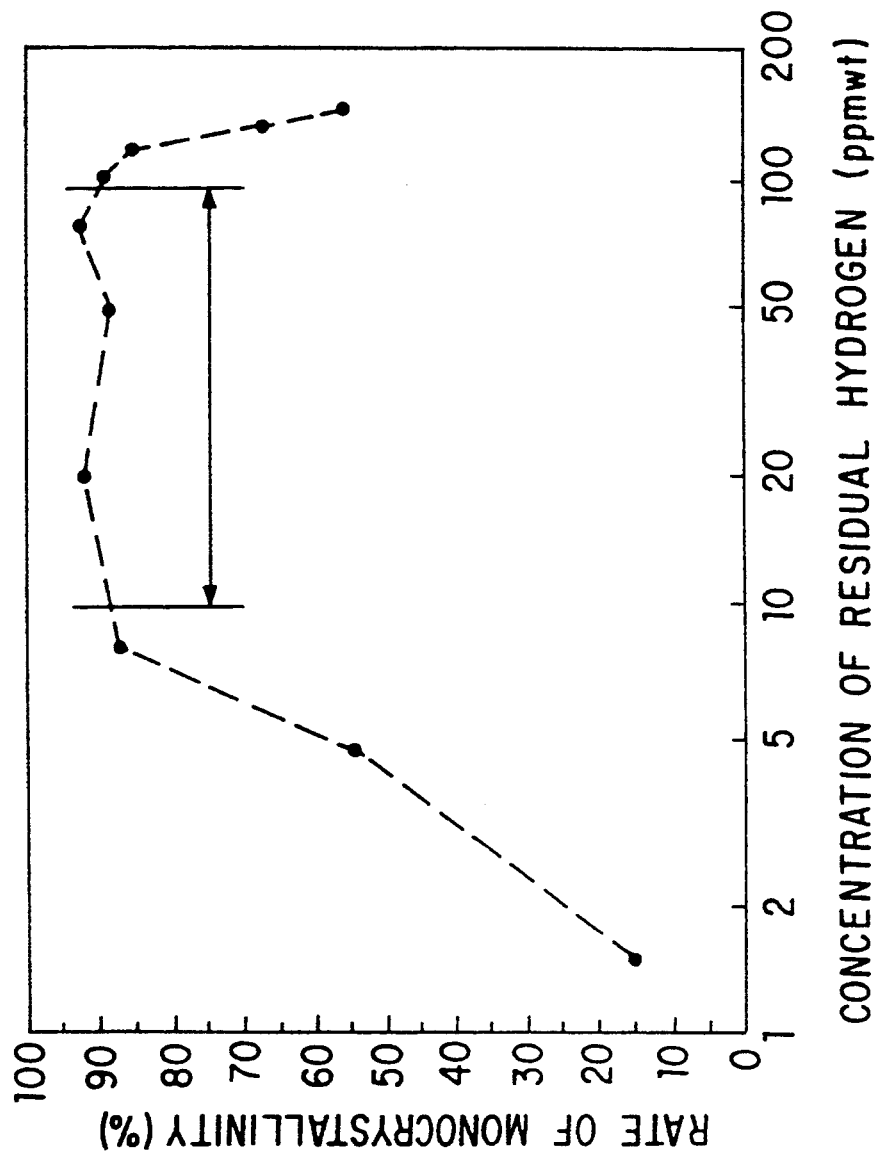
FIG. 2 is a graph of a relation of amounts of residual or contained hydrogen and the crystallinity of the silicon single crystal.

FIG. 2 shows relations of concentrations of the residual hydrogen and rates of monocrystallinity of resulting silicon crystal rods. The rates of monocrystallinity of the silicon crystal rods were computed as follows: Lots of grains of silicon polycrystal having different concentrations of the residual hydrogen were prepared. Multiple batches of silicon single crystal growth were performed from each lot of the grain of silicon polycrystal on the same condition of crystal growth by the same silicon single crystal puller. The number of resulting silicon single crystals having no polycrystallization devided by the number of growth batches from each lot of grains of silicon polycrystal gave the rates of monocrystallinity of the silicon single crystals.

The test resulted in a rate of monocrystallinity of 80% where the concentration of the residual hydrogen is more than 6 ppmwt and less than 125 ppmwt and a rate of monocrystallinity of 90% or more where the concentration of the residual hydrogen is more than 10 ppmwt and less than 100 ppmwt.

The present invention is not rigidly restricted to the embodiments described above. It is to be understood that a person skilled in the art can easily change and modify the present invention without departing from the scope of the invention defined in the appended claims.

What is claimed is:

1. A process for producing a silicon single crystal, comprising the steps of:
   providing a silicon melt in a crucible;
   feeding grains of silicon polycrystal to the silicon melt, the concentration of residual hydrogen in the grains of silicon polycrystal being more than 10 ppmwt and less than 100 ppmwt; and
   pulling up a silicon single crystal from the silicon melt.

2. A process for producing a silicon single crystal, comprising the steps of:
   providing a silicon melt in a crucible;
   continuously feeding a controlled amount of grains of silicon polycrystal to the silicon melt concurrently with a growth of a silicon single crystal, the concentration of residual hydrogen in the grains of silicon polycrystal being more than 10 ppmwt and less than 100 ppmwt; and
   pulling up the silicon single crystal from the silicon melt.

* * * * *